(12) United States Patent
Yaguchi et al.

(10) Patent No.: US 6,927,489 B1
(45) Date of Patent: Aug. 9, 2005

(54) SEMICONDUCTOR DEVICE PROVIDED WITH REWIRING LAYER

(75) Inventors: Akihiro Yaguchi, Tsuchiura (JP); Hideo Miura, Tsuchiura (JP); Atsushi Kazama, Tsuchiura (JP); Asao Nishimura, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/787,526
(22) PCT Filed: Mar. 14, 2000
(86) PCT No.: PCT/JP00/01550
§ 371 (c)(1),
(2), (4) Date: Dec. 30, 2002
(87) PCT Pub. No.: WO00/55910
PCT Pub. Date: Sep. 21, 2000

(30) Foreign Application Priority Data

Mar. 15, 1999 (JP) .................................. 11/067839

(51) Int. Cl.[7] .................. H01L 23/48; H01L 23/52; H01L 29/40
(52) U.S. Cl. .................. 257/734; 257/690; 257/738
(58) Field of Search .................. 257/690, 730–739, 257/720, 780

(56) References Cited

U.S. PATENT DOCUMENTS 6,051,450 A * 4/2000 Ohsawa et al. ............. 257/737

FOREIGN PATENT DOCUMENTS

| EP | 0 706 208 A2 | 4/1996 |
|---|---|---|
| JP | 6-504408 | 5/1994 |
| JP | 07-211722 | 8/1995 |
| JP | 08-330313 | 12/1996 |
| JP | 09-129772 | 5/1997 |
| JP | 10-012768 | 1/1998 |
| JP | 10-214911 | 8/1998 |
| JP | 10-289966 | 10/1998 |
| JP | 11-054649 | 2/1999 |
| JP | 2000-068671 | 3/2000 |
| WO | WO 98/32170 | 7/1998 |

OTHER PUBLICATIONS

International Search Report, date of mailing Jun. 13, 2000.
Ichirou Anjoh, et al., Development of Tape BGA Type CSP, Technical Report of The Institute of Electronics, Information and Communication Engineers, CPM96–121, ICD96–160 (Dec. 1996) Abstract.
Nikkei Micro Devices, Apr. 1998 (pp. 164–167)—Disclosed in specification—Translation not available.

* cited by examiner

Primary Examiner—Cuong Nguyen
(74) Attorney, Agent, or Firm—Antonelli, Terry, Stout & Kraus, LLP

(57) ABSTRACT

In a small semiconductor device having external terminals on a semiconductor element and a semiconductor module mounted with the small semiconductor device, disconnection of the external terminals is prevented when a temperature change occurs under the conditions that the semiconductor device is mounted on a printed circuit board. To achieve this a projection is formed on a land which is an external terminal bonding area of the semiconductor device, and a protruded portion of the projection is bonded to the external terminal. An intervening portion of a protective film made of resin material is formed between the lands and semiconductor element.

12 Claims, 13 Drawing Sheets

SEMICONDUCTOR DEVICE PROVIDED WITH REWIRING LAYER

TECHNICAL FIELD

The present invention relates to a small semiconductor device having external terminals on a semiconductor element, and, more particularly, to a small semiconductor device having a semiconductor element with various functions manufactured by wafer processes and to a semiconductor module having a semiconductor device with external terminals mounted on a printed circuit board.

BACKGROUND ART

Flip chip bonding has been conventionally used as high density mount technology for mounting a semiconductor element on a printed circuit board or the like without packaging it. With this flip chip bonding technology, external terminals are formed on pads of a semiconductor element, and the pads of the semiconductor element and bonding pads on a printed circuit board are electrically and mechanically connected via the external terminals.

With flip chip bonding, however, the layout and size of external terminals are restricted by the layout and size of pads of a semiconductor element. The pad size of a semiconductor element is about 50 μm at a maximum and the pad space is about 100 μm. In a general printed circuit board using resin material as its base material, the size of a bonding pad is about 200 μm at a minimum and the bonding pad space is about 500 μm. Therefore, with mount technology using flip chip bonding, it is difficult to mount a semiconductor element on a printed circuit board made of resin material as its base material.

In order to solve the above-described problem associated with mount technology using flip chip bonding, there is a remarkable tendency that the size of a semiconductor device to be substantially equal to that of a semiconductor element. A package of such a semiconductor device is generally called a CSP (chip size package or chip scale package). Examples of CSP are described in JP-A-6-504408, Technical Report of the Institute of Electronics, Information and Communication Engineers "Development on Tape BGA type CSP", CPM96-121, ICD96-160 (December, 1996) and the like.

DISCLOSURE OF INVENTION

As noted above, the size of a conventional package for a CSP semiconductor device is approximately equal to the size of a semiconductor element. Namely, a sheet-shaped member made of a film base material formed with conductive wiring lines and lands is attached to the surface of a semiconductor element with adhesive, and external terminals are formed in a projected area of the principal surface of the semiconductor element.

With conventional CSP techniques in which external terminals are disposed in the projected area of the principal surface of a semiconductor element, metal bumps such as solder bumps are used as the external terminals and connected to a printed circuit board. A problem associated with CSP having such a structure is a connection reliability of solder bumps.

A coefficient of linear thermal expansion of a semiconductor element (silicon (Si)) is about $(3\times10^{-6})/°$ C., and a coefficient of linear thermal expansion of a printed circuit board (FR-4 or the like) made of glass epoxy resin group most generally used is about $(17\times10^{-6})/°$ C. If there is a large coefficient of linear thermal expansion difference therebetween and a semiconductor device is subjected to a temperature change, thermal strain is generated in an external terminal which is a solder bump.

Strain generated in the bump is concentrated close to the bonding area between the bump and a land of a semiconductor device or a bonding pad of a printed circuit board. If such a temperature change is repeated, a crack may be formed in the bonding area. The crack formed in the bonding area of the bump gradually grows and the bonding area of the bump is ultimately broken. As the bump of the external terminal is broken, electrical connection between the semiconductor device and an external apparatus via external terminals cannot be maintained. Reliability of semiconductor devices is therefore lowered considerably.

JP-A-6-504408 discloses CSP type semiconductor devices which take a fatigue failure of solder bumps into consideration and are considered as having a high reliability. In this semiconductor device, a sheet-shaped member is attached to the principal surface of a semiconductor element with adhesive which is made of soft and flexible material having a low elasticity ((e.g., elastomer resin: polymer substance having a rubber-like elasticity at an ordinary temperature). Material having an elastic coefficient approximately equal to that of the adhesive is used as a sealing member. Therefore, a coefficient of linear thermal expansion difference between a semiconductor element and a printed circuit board can be absorbed by the adhesive which is made of soft and flexible elastomer resin. Thermal strain applied to a solder bump can therefore be reduced.

This semiconductor device requires, however, specific techniques for each of a process of preparing soft and flexible material, a process of connecting internal wiring lines by leads, and a process of sealing with sealing member. Therefore, if this package is to be manufactured with conventional wafer processes for semiconductor elements, new manufacture facilities are required posing a problem of an increase of the number of processes and the manufacture cost.

The above-mentioned conventional semiconductor device has the leads whose circumferential areas are covered with soft sealing member so that a large deformation is applied to the leads because of thermal deformation of soft adhesive and there results a possibility of disconnection of the lead.

An example of a CSP type semiconductor device manufactured by wafer processes to improve the solder bump reliability and reduce manufacturing cost has been proposed in "Advent of Low Cost Method for CSP Expected as Main Candidate for Chip Size Mount", Nikkei Micro Devices, April, 1998 (pp. 164 to 167).

This conventional semiconductor device is manufactured by forming additional wiring lines on a semiconductor element, a column-like member called a via post made of metal is formed in the additional wiring line, and the circumferential area of the via post is sealed with resin. A solder bump is bonded via a barrier metal layer to the upper surface of the via post not covered with the sealing resin. With this semiconductor device, deformation of the solder bump near at the bonding area on the semiconductor device side is suppressed by the via post which has a large rigidity, so that strain to be generated in the bonding area can be reduced effectively. However, as the strain in the bonding area on the semiconductor device side is reduced, the strain to be generated by a linear expansion coefficient difference between the semiconductor element and a printed circuit board increases correspondingly in the bonding area on the printed circuit board side. It is, therefore, difficult to improve the reliability of the semiconductor device as a whole.

Similar to CSP, flip chip bonding techniques are also associated with the problem of a connection reliability of a solder bump which is an external terminal. Countermeasure techniques for improving the reliability of a solder bump bonding area by utilizing the flip chip bonding techniques are described in JP-A-7-211722, in which a bump electrode for an external terminal is formed by first and second metal layers formed on the pad of a semiconductor element via a metal thin film, and the bump electrode is connected to the bonding pad of a printed circuit board.

With this conventional technique, the first metal layer protruded from the pad can increase the height of the bump electrode so that thermal strain to be generated in the bump electrode can be reduced. However, as a semiconductor element is mounted on a printed circuit board made of resin material as its base material by using flip chip bonding techniques, thermal strain concentrates upon the bonding area on the semiconductor element side having a smaller bonding area size. This thermal strain concentration results because of a size difference between the bonding areas on the sides of both the semiconductor element and printed circuit board. Sufficient thermal strain reduction effects therefor cannot be obtained.

Further, since the layout of bump electrodes as the external terminals is dependent upon the layout of bonding pads of the semiconductor element, the wiring design of the printed circuit board cannot be made freely, which becomes a factor of hindering standardization of printed circuit boards.

The present invention aims to solve the above problems and provide a semiconductor device and a semiconductor module having a high reliability capable of preventing and suppressing disconnection of, particularly, external terminals.

The above-described problems can be solved by adopting the following structures each suppressing and reducing strain to be generated in an external terminal because of a coefficient of linear thermal expansion difference between a printed circuit board and a semiconductor device. The semiconductor device has a semiconductor element, a passivation film, a conductive wiring line connected to each pad of the semiconductor element, a land connected to each conductive wiring line, an insulating protective film, and external terminals.

(1) A projection is formed on the land to which the external terminal is bonded. This projection is bonded to the external terminal made of solder material or the like, and the protective film is formed between the passivation film and land.

It is desired that the projection is bonded to the external terminal so that the projection protrudes into the inside of the external terminal.

The land of a semiconductor device is made of metal material such as copper (Cu). This material has a higher rigidity than those of solder used as the material of the external terminal and the protective film covering the semiconductor element surface. Since the projection and external terminal are bonded together in the above manner, distortion of the external terminal in the bonding area on the semiconductor device side is restricted by the projection. Thermal strain to be generated in the bonding area on the semiconductor device side can therefore be reduced.

The protective film is intervened between the land and the passivation film on the semiconductor element surface. The protective film is made of resin material which, generally, has a smaller elastic modulus than those of the materials of the land and external terminal. Since the protective film having a smaller elastic modulus is intervened between the land to be bonded to the external terminal and the passivation film on the semiconductor element surface, deformation to be generated in the external terminal because of a linear expansion coefficient difference between the semiconductor device and printed circuit board can be relaxed by the deformation of the protective film. It is, therefore, possible to reduce strain to be generated in the bonding areas on the sides of both the semiconductor device and printed circuit board.

(2) Further, the conductive wiring line is constituted of a first conductive wiring line connected to the pad of a semiconductor element and a second conductive wiring line connected to the first conductive wiring line and land. The protective film is constituted of a first protective film connected to the first and second conductive wiring lines and a second protective film having an exposed surface on the side where the external terminal is formed.

It is preferable that the first protective film is intervened just under the land.

It is also preferable that a projection is formed on the land, and the land and external terminal are bonded together.

It is also preferable that in the structure of the semiconductor device described above, the first and second conductive wiring lines are connected in an area excepting the area just under the land.

With the structure described above, the first and second conductive wiring lines are disposed in a lamination structure along the depth direction of the semiconductor device so that the protective film can be intervened between the land connected to the second conductive wiring line and the semiconductor element. It is, therefore, possible to reduce strain to be generated in the bonding areas on the sides of both the semiconductor device and printed circuit board.

Since the conductive wiring line is made of metal material such as copper (Cu) having a rigidity larger than that of the protective film, if the connection area between the first and second conductive wiring lines is in a projected area of the land, the strain relaxation effects of the protective film are degraded. It is, therefore, desired that the first and second conductive wiring lines are connected in an area excepting the projected area of the land.

It is preferable that the second protective film is made of material having a larger elastic modulus than that of the first protective film. It is, therefore, possible to prevent disconnection because the deformation amount of the second conductive wiring line can be reduced.

(3) Still further, the insulating protective film is constituted of a first protective film to be connected to the land and formed between the semiconductor element and land and a second protective film having an exposed surface on the side where the external terminal is formed.

As described above, the first protective film is formed in contact with the land. The first protective film is, generally, made of resin material such as polyimide having an elastic modulus smaller than that of the land and external terminal forming material. Since the first protective film having a smaller elastic modulus is formed in contact with the land to be bonded to the external terminal, deformation to be generated in the external terminal because of a coefficient of linear thermal expansion difference between the semiconductor device and printed circuit board can be relaxed by the deformation of the first protective film. It is, therefore, possible to reduce strain to be generated in the bonding areas on both sides of the semiconductor device and printed circuit board. The second protective film is formed having an exposed surface on the side where the external terminal is formed and being in contact with the conductive wiring line and the land on the external terminal formed side, to thereby protect the conductive wiring line and land.

It is preferable that the second conductive film is made of material having a larger elastic modulus than that of the first conductive film. It is, therefore, possible to prevent disconnection because the deformation amount of the conductive wiring line can be reduced.

(4) Still further, in the semiconductor device described above, the projection is formed in the projected area of the land and the end of the land is positioned outside of the side edge of the projection.

As described above, although thermal strain to be generated in the external terminal because of a temperature change can be reduced through restriction of the deformation of the external terminal by the projection having a large rigidity, deformation to be generated by the coefficient of linear thermal expansion difference between the semiconductor device and printed circuit board acts upon the projection itself. This deformation of the projection generates stress at the interface between the land formed with the projection and the protective film. The stress is concentrated upon particularly the end of the land, and a crack of the protective film may be formed starting from this concentrated area. In order to prevent this crack of the protective film, the land end is disposed outside of the side edge of the projection. Therefore, the contact area between the land and protective film increases so that the stress generated at the interface therebetween can be distributed into a broad area and the stress concentrated to the land end can be relaxed.

(5) It is preferable that the projection and external terminal of the semiconductor device are bonded together via a metal thin film formed on the surface of the projection.

As the metal thin film such as gold (Au) and nickel (Ni) is formed in the bonding area of the projection to be bonded to the external terminal, a connection reliability can be improved.

(6) In a semiconductor module having the semiconductor device mounted on a printed circuit board via external terminals, the bonding area between a bonding pad of the printed circuit board and the external terminal is set larger than the bonding area between the projection and external terminal, along the direction of disposing external terminals.

(7) Still further, in the semiconductor module having the semiconductor device mounted on the printed circuit board via external terminals, the circumferential area of the bonding area between the bonding pad of the printed circuit board and the external terminal is covered with resin.

In a comparison of the strains to be generated in the bonding areas on both sides of the semiconductor device and printed circuit board, the strain in the bonding area on the semiconductor device side with the adjacent first protective film having a low elasticity and the projection is larger than the strains in the bonding area on the printed circuit board side. In this invention, in order to reduce the strain to be generated in the bonding area on the printed circuit board, the bonding area between a bonding pad of the printed circuit board and the external terminal is set larger than the bonding area between the projection and external terminal, along the direction of disposing external terminals. The strain to be generated in the bonding area of the external terminal becomes smaller as the bonding area becomes broader. This is because if the size of the land of the semiconductor device or the size of the bonding pad of the printed circuit board is made large to increase the bonding area, the rigidity of the bonding area increases and the deformation amount of solder is reduced. As described above, as the bonding area on the printed circuit board side is made broader than that on the semiconductor device side, the strain to be generated in the bonding area on the printed circuit side can be reduced so that a difference from the strain on the package side can be made small. It is, therefore, possible to improve the reliability of the semiconductor module as a whole.

The circumferential area of the bonding area between the bonding pad of the printed circuit board and the external terminal is covered with resin. The strain to be generated in the bonding area is distributed, also, into the interface between the external terminal and resin so that the strain to be generated in the bonding area between the external terminal and bonding pad can be reduced. It is, therefore, possible to reduce a difference between the strains to be generated in the bonding areas on both sides of the package and printed circuit board and to improve the reliability of the semiconductor module as a whole.

BEST MODES FOR CARRYING OUT THE INVENTION

The invention will be detailed with reference to the accompanying drawings.

Figure 1A:
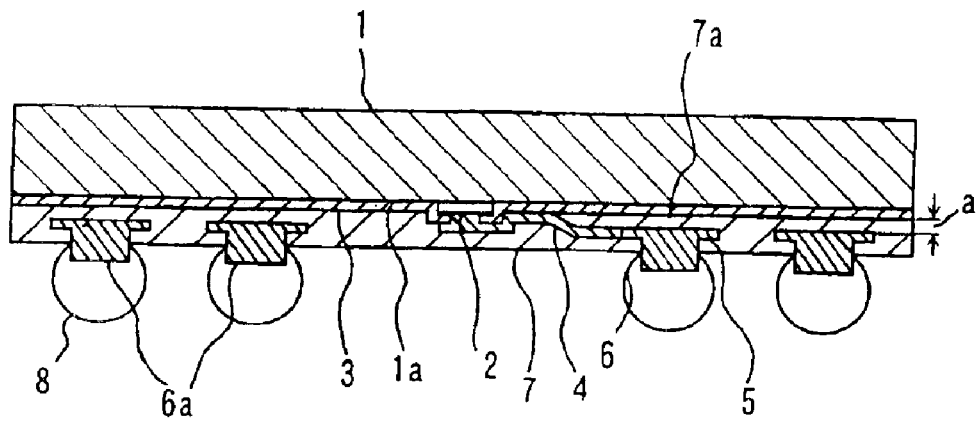
FIG. 1(a) is a cross sectional view of a semiconductor device according to a first embodiment of the invention and FIG. 1(b) is a plan view of the semiconductor device with a portion of its protective film being removed.
Figure 1B:
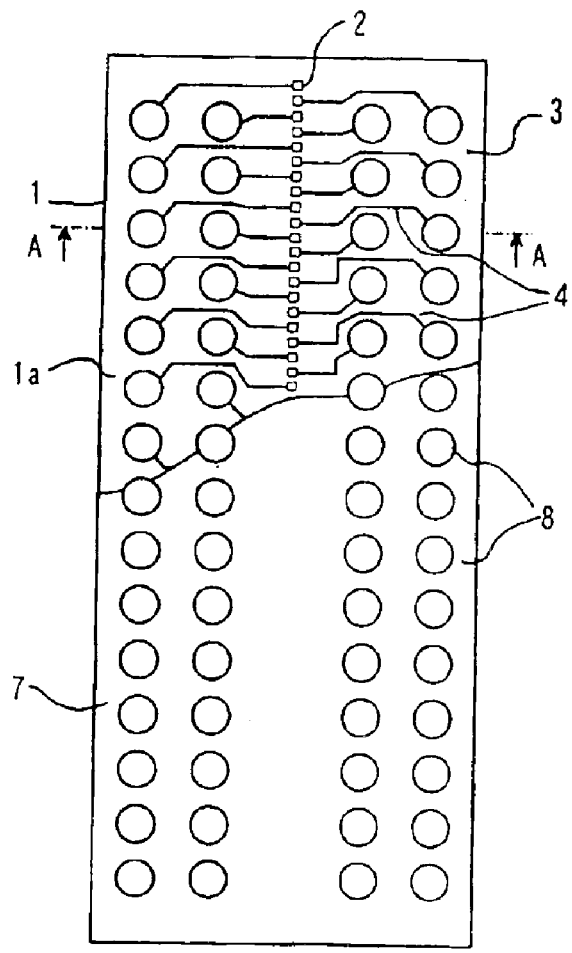

FIG. 1(a) is a cross sectional view showing a semiconductor device according to the first embodiment of the invention. FIG. 1(b) is a plan view of the semiconductor device shown in FIG. 1(a) with a portion of a protective film being removed. The cross sectional view of FIG. 1(a) is a view taken along line A—A shown in FIG. 1(b).

As shown in FIGS. 1(a) and 1(b), the semiconductor device of the first embodiment of this invention has a semiconductor element 1, a passivation film 3 formed on the surface 1a of the semiconductor element and exposing the surfaces of each pad 2, a conductive wiring line 4 connected to each pad 2, a land 5 connected to each conductive wiring line 4, a protective film 7, a projection 6 formed on each land 5, and external terminals 8.

The pads 2 are disposed vertically in the central area of the surface 1a of the semiconductor element. The conductive wiring line 4 connected to each pad 2 extends to the land 5 on the semiconductor element surface 1a on which the projection 6 is formed. The protective film 7 covers the passivation film 3, conductive wiring lines 4, lands 5 and portions of the projections 6 respectively formed on the semiconductor element surface 1a, and is also disposed between the lands 5 and passivation film 3 to form an intervening portion 7a of the protective film. A portion of the projection 6 protrudes from the protective film 7, and this protruded portion 6a and a corresponding external terminal 8 are bonded together. The pad 2 and external terminal 8 of the semiconductor element 1 are electrically connected via the conductive wiring line 4, land 5 and projection 6.

The conductive wiring line 4 is made of one of materials such as copper (Cu), aluminum (Al), gold (Au) and silver (Ag) or alloy of these materials. The surface of the conductive wiring line 4 may be plated with nickel (Ni), chrome (Cr) or the like. The land 5 connected to the conductive wiring line 4 is made of the same material as that of the conductive wiring line.

The external terminal 8 is formed by placing spherical or paste solder material (e.g., Pb—Sn group eutectic crystal solder, Sn—Ag—Cu group solder) or the like on the protruded portion 6a of the projection and then melting the solder to be connected to the land 5.

The material of the protective film 7 may be polyimide resin, polyether imide resin, acrylic denatured epoxy resin, epoxy resin mixed with rubber, silicone resin or the like, respectively of a liquid type or a film shape.

The elastic modulus of the material used for the conductive wiring line 4 and land 5 is, for example, about 110 GPa for copper (Cu). The material usable for the protective film 7, for example, polyimide resin, has an elastic modulus of about 1 to 9 GPa at a room temperature. The elastic modulus of the material of the protective film 7 is therefore smaller than that of the material of the land 5. The elastic modulus of the protective film 7 may be set even smaller by selecting a proper material.

According to the semiconductor device of the first embodiment of the invention described above, the external terminal 8 is bonded to the protruded portion 6a of the projection 6 formed on the land 5. Therefore, even if there is a temperature change under the conditions that the semiconductor device is mounted on a printed circuit board, deformation of the external terminal 8 near at the bonding area between the projection 6 and external terminal 8 on the semiconductor device side can be restricted by the projection 6 so that the deformation amount can be made small. Thermal strain to be generated in the external terminal 8 near at the bonding area on the semiconductor device side can, therefore, be reduced.

Further, the intervening portion 7a of the protective film 7 is disposed between the land 5 and the passivation film 3 on the semiconductor element surface 1a. Therefore, any strain to be generated in the external terminal 8 because of a coefficient of linear thermal expansion difference between the semiconductor device and printed circuit board can be relaxed by the deformation of the intervening portion 7a of the protective film which has a lower elastic modulus than that of the material of the land 5. Strains generated in the bonding areas on both sides of the semiconductor device and printed circuit board can, therefore, be reduced.

With these functions, even if there is a temperature change under the conditions that the semiconductor device is mounted on the printed circuit board, disconnection defects to be generated in the bonding area of the external terminal can be prevented, and a semiconductor device and a semiconductor module having a high reliability can be realized.

Still further, according to the semiconductor device of the first embodiment of the invention, the conductive wiring line 4 is formed on the semiconductor element surface 1a and the projection 6 and external terminal 8 are bonded on the land 5 which is formed at a position remote from the pad 2. Therefore, even if water contents enter the inside of the semiconductor device from the bonding area of the external terminal 8, they can be prevented from reaching the pad 2. Electrical conduction defects to be caused by corrosion of the pad 2 can therefore be suppressed.

Also, since the land 5 to be bonded to the external terminal 8 is disposed at a position remote from the pad 2, the size of the land 5 can be made larger than that of the pad. The bonding area between the external terminal 8 and land 5 or between the external terminal 8 and projection 6 of this embodiment can be made large. As the bonding area is made large, strain to be generated in the external terminal bonding area because of a coefficient of linear thermal expansion difference between the semiconductor device and printed circuit board is loaded upon the large bonding area. The strain in the bonding area boarder from which a crack may be formed can effectively be reduced.

Bonding between the external terminal 8 and the protruded portion 6a of the projection 6 formed on the land 5 is established by melting solder material of the external terminal 8. In order to improve bonding between the projection 6 and external terminal 8, the protruded portion 6a of the projection 6 in the bonding area may be plated with a metal thin film. The metal thin film may use material such as gold (Au) and nickel (Ni).

FIG. 2 (including FIGS. 2(a)–2(h)) shows cross sectional views illustrating a method of manufacturing the semiconductor device of the first embodiment of the invention shown in FIG. 1.

Figure 2A:
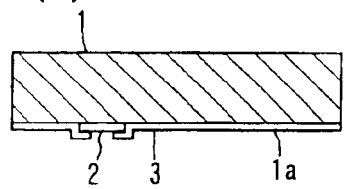
FIGS. 2(a)–2(h) are partial cross sectional views illustrating a method of manufacturing the semiconductor device of the first embodiment shown in FIG. 1 (including FIGS. 1(a) and 1(b)).
Figure 2B:
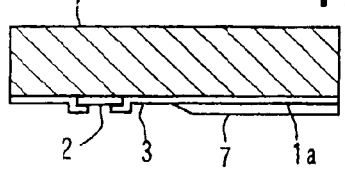
Figure 2C:
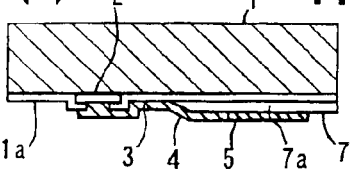
Figure 2D:
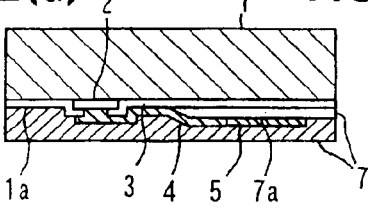
Figure 2E:
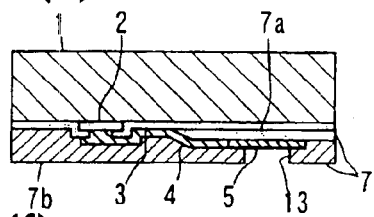
Figure 2F:
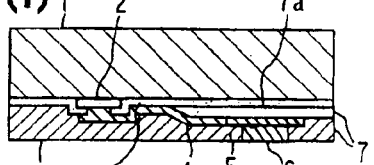
Figure 2G:
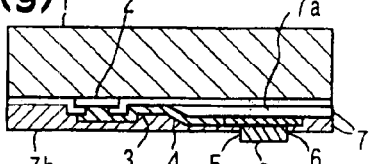
Figure 2H:
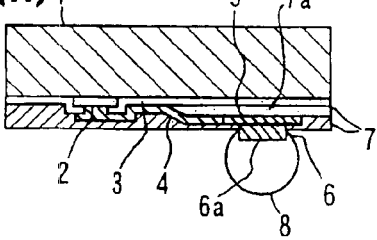

On the surface 1a of a semiconductor element 1 formed with a passivation film 3 exposing a portion of a pad 2 and on the surface of the pad 2 (FIG. 2(a)), a protective film 7 of polyimide resin or the like is formed by a potting method, a printing method, attachment of a film material or the like (FIG. 2(b)). A conductive wiring line 4 is formed extending from the pad 2 to the surface of the protective film 7, and at the same time, a land 5 is formed on the surface of the protective film 7 (FIG. 2(c)). The conductive wiring line 3 and land 5 are formed by a plating method or a sputtering method. The protective film 7 on the semiconductor element surface 1a forms an intervening portion 7a of the protective film between the land 5 and semiconductor element surface 1a. Another protective film 7 is formed covering the conductive wiring line 4 and land 5 over the semiconductor element surface 1a (FIG. 2(d)). An opening 13 is formed through the protective film 7 from its surface 7b to expose the surface of the land 5 (FIG. 2(e)). This opening 13 may be formed by covering an area, where the opening 13 is not formed, with a mask, etching the protective film and removing the mask, or by using a laser beam. Metal material such as copper (Cu) is filled in the opening 13 by a sputtering method or a plating method to from a projection 6 on the land 5 (FIG. 2(f)). The protective film 7 is etched from its surface 7b to protrude a portion of the projection 6 from the surface 7a of the protective film 7 to form a protruded portion 6a (FIG. 2(g)), and an external terminal 8 made of solder material is bonded to the protruded portion 6a of the projection 6 (FIG. 2(h)). The wafer is then cut into a predetermined size to form the semiconductor device of the first embodiment of the invention.

The semiconductor device manufacture method described with reference to FIG. 2 is similar to a general method of manufacturing semiconductor devices from a wafer.

The material of the protective film 7 has an elastic modulus selected based on the size of a semiconductor element and the number and layout of external terminals. In order to enhance the relaxation effects of strain by deformation of the intervening portion 7a of the protective film, the strain being generated in the bonding area, the material having a small elastic modulus, preferably in a range from 0.5 GPa to 3 GPa, is used. It is also desired that the material has such an elastic modulus at a low temperature (about −50° C.). In order to retain the strain reduction effect, it is necessary that a thickness a of the intervening portion 7a shown in FIG. 1(a) is set to some degree. The thickness a of the intervening portion 7a of the protective film between the land 5 and passivation film is, preferably, changed with the elastic modulus of the material of the protective film 7. It is necessary that as the elastic modulus of the protective film is made higher, the intervening portion 7a is made thicker. For example, if polyimide resin is used as the material of the protective film 7, it is desired to select polyimide resin having an elastic modulus of about 1 GPa to 3 GPa and set the thickness a of the intervening portion 7a to 20 μm or thicker.

The protective film 7 may be made of single material or may have a lamination structure made of a plurality of materials. In the latter case, it is also desired that the elastic modulus of the whole protective film is in the above-described range from 0.5 GPa to 3 GPa.

Figure 3:
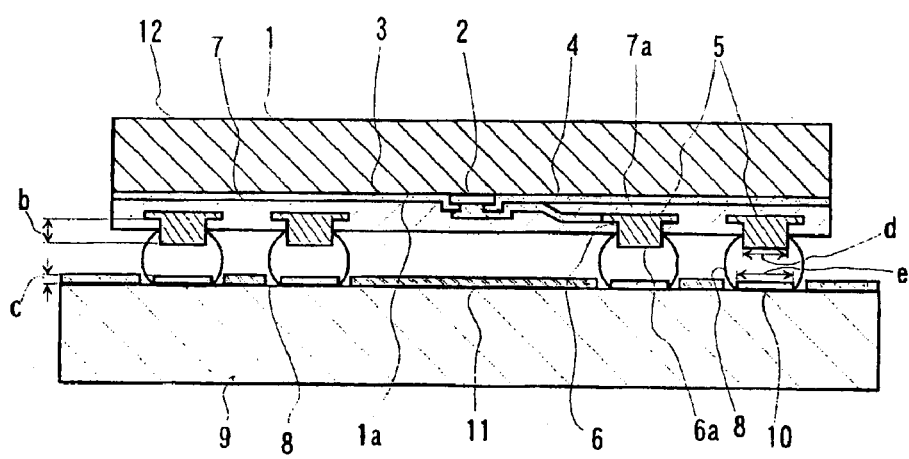
FIG. 3 is a cross sectional view of a semiconductor module having the semiconductor device of the first embodiment shown in FIG. 1 mounted on a printed circuit board.

FIG. 3 is a cross sectional view of a semiconductor module having the semiconductor device of the first embodiment shown in FIG. 1 mounted on a printed circuit board, according to the first embodiment.

A semiconductor device 12 shown in FIG. 3 is mechanically and electrically connected to a printed circuit board 9, by bonding external terminals 8 formed on the surface of the semiconductor device 12 to bonding pads 10 formed on the surface of the printed circuit board 9. On parts of the surface of the printed circuit board 9 where the bonding pads 10 are not formed, a resist film 11 is formed in order to protect unrepresented internal wiring of the printed circuit board 9.

The printed circuit board 9 is typically a glass/epoxy board (e.g., FR-4) made of epoxy resin as a base material mixed with glass cloth. Instead of epoxy resin, a board made of BT resin, aramid (aromatic polyamide) resin or the like may also be used.

The semiconductor device of the first embodiment is desired to satisfy b≧c, where b is a height of the protruded portion 6a of the projection 6 on the land 5 to be bonded to the external terminal 8 shown in FIG. 3, and c is a height of the bonding pad 10 of the printed circuit board 9 to be bonded to the external terminal 8.

As in the semiconductor device of the first embodiment of the invention, a portion of the projection 6 on the land 5 enters the inside of the external terminal 8 to be bonded so that strain to be generated in the external terminal 8 can be reduced. Similarly, the bonding pad 10 on the printed circuit board 9 side in the bonding area enters the inside of the external terminal 8 so that strain to be generated in the bonding area can be reduced.

If a semiconductor device without the projection 6 on the land 5 and the intervening portion 7a of the protective film, such as shown in FIG. 1, is mounted on a printed circuit board, strain generated in the bonding area of the external terminal 8 on the printed circuit board side is smaller than strain generated in the semiconductor device side. This is because the coefficient of linear thermal expansion of the printed circuit board is similar to that of solder material of the external terminal 8 and the printed circuit board has a lower elastic modulus than the semiconductor device which is mainly occupied by the semiconductor element 1.

In the semiconductor device of the first embodiment, the projection 6 on the land 5 is bonded to the external terminal 8 so that the rigidity in the bonding area becomes large and strain to be generated in the bonding area on the semiconductor device side can be reduced. In addition, a difference between strains to be generated in the bonding areas on both sides of the semiconductor device and printed circuit board can be made small. In the bonding area of the printed circuit board side, as a height c of the bonding pad 10 entering the inside of the external terminal 8 is made large, although strain in the bonding area in the printed circuit board side is reduced, strain in the bonding area on the semiconductor device side increases correspondingly. Therefore, if the height b of the protruded portion 6a is set equal to or larger than the height c of the bonding pad 10 of the printed circuit board 9 to be bonded to the external terminal 8, a difference between strains to be generated in both the bonding areas can be made small, and the reliability of the module can be improved as a whole.

Also in the semiconductor module of the first embodiment of the present invention, it is desired that the bonding area between the bonding pad 10 of the printed circuit board 9 and the external terminal 8 in a horizontal direction, i.e., in a direction of disposing external terminals, is set larger than the bonding area between the protruded portion 6a of the projection 6 on the land 5 of the semiconductor device 12 and the external terminal 8. In this embodiment, the plan shape of the projection 6 and bonding pad 10 is circular. In order to make the bonding area on the printed circuit board side broader than that on the semiconductor device side, a relation of e>d is satisfied where d is a diameter of the protruded portion 6a of the projection 6 and e is a diameter of the bonding pad of the printed circuit board.

By setting the bonding area on the printed circuit board side broader than on the semiconductor device side, the rigidity of the bonding pad 10 increases so that it is possible to reduce the strain to be generated in the bonding area of the external terminal on the printed circuit board side. It is also possible to make small a difference between the strain to be generated in the bonding area of the external terminal on the printed circuit board side and the strain produced by bonding of the protruded portion 6a of the projection 6 in the bonding area of the external terminal on the semiconductor device side. With these functions, even if there is a temperature change, disconnection defects to be generated in the bonding areas of the external terminal on both sides of the semiconductor device and printed circuit board can be prevented, and a semiconductor module having a high reliability as a whole can be realized.

Figure 4:
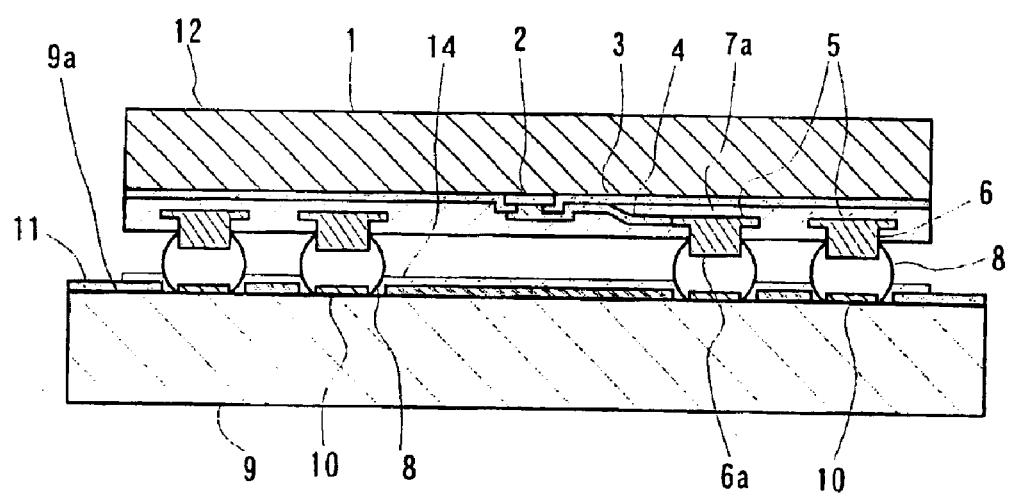
FIG. 4 is a cross sectional view showing another example of a semiconductor module having the semiconductor device of the first embodiment shown in FIG. 1 mounted on a printed circuit board.

FIG. 4 is a cross sectional view showing another example of a semiconductor module having the semiconductor device shown in FIG. 1 mounted on a printed circuit board.

In this semiconductor module shown in FIG. 4, on a semiconductor device mount surface 9a of a printed circuit board 9, a reinforcing resin layer 14 is formed covering at least the periphery of the bonding area between the external terminal 8 and bonding pad 10.

The reinforcing resin layer may be made of epoxy resin, epoxy resin filled with silica particles, or the like. The reinforcing resin layer 14 is formed by mounting a semiconductor device 12 on the printed circuit board 9, thereafter flowing liquid resin on the printed circuit board surface 9a, heating and hardening it.

By covering the bonding area between the bonding pad 10 of the printed circuit board 9 and the external terminal 8 with the reinforcing resin layer 14, strain to be generated in the bonding area of the external terminal on the printed circuit board side can be relaxed and reduced. As the strain in the bonding area of the external terminal on the printed circuit board side is reduced, there exists no difference between the strain to be generated in the bonding area between the protruded portion 6a of the projection 6 and the external terminal 8 and the strain reduced by a presence of the intervening portion 7a of the protective film in the bonding area on the semiconductor device side. It is therefore possible to reduce strain to be generated in the external terminal bonding area of the whole semiconductor device.

Figure 5:
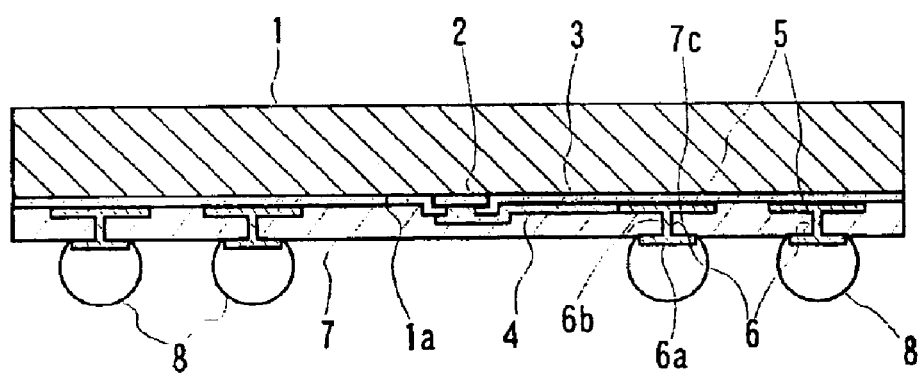
FIG. 5 is a cross sectional view of a semiconductor device according to a second embodiment of the invention.

FIG. 5 is a cross sectional view of a semiconductor device according to the second embodiment of the invention.

The fundamental structure of the semiconductor device of the second embodiment of the invention shown in FIG. 5 is similar to the first embodiment shown in FIG. 1. A different point from the first embodiment resides in that a portion 6b of a projection 6 surrounded by a protective film 7 is narrower than a protruded portion 6a to be bonded to an external terminal 8 so that an intervening portion 7c of the protective film 7 exists in a projected area of the protruded portion 6a of the projection 6.

According to the semiconductor device of the second embodiment of the invention, the intervening portion 7c of the protective film 7 exists in a projected area of the protruded portion 6a of the projection 6. Therefore, deformation of the external terminal 8 to be caused by a coefficient of linear thermal expansion difference between the semiconductor device and printed circuit board can be relaxed by deformation of the intervening portion 7c of the protected film 7 which has a lower elastic modulus than that of the material of the land 5. Strains to be generated in the bonding area on both sides of the semiconductor device and printed circuit board can be reduced.

FIG. 6 (including FIGS. 6(a)–6(h)) shows cross sectional views illustrating a method of manufacturing the semiconductor device of the second embodiment of the invention shown in FIG. 5.

Figure 6A:
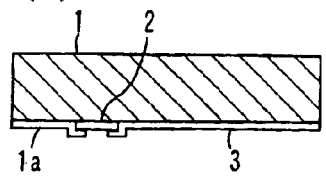
FIGS. 6(a)–6(h) are partial cross sectional views illustrating a method of manufacturing the semiconductor device of the second embodiment shown in FIG. 5.
Figure 6F:
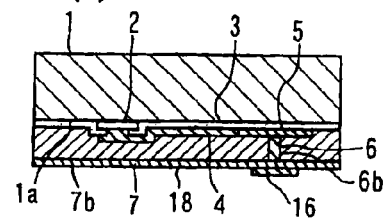
Figure 6B:
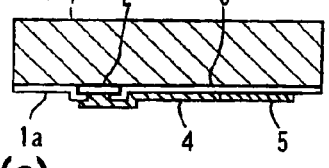
Figure 6C:
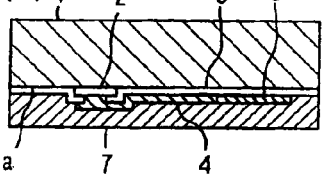
Figure 6G:
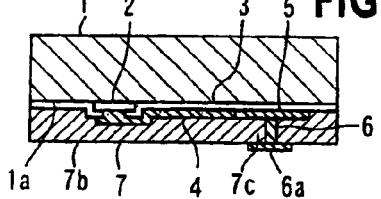
Figure 6D:
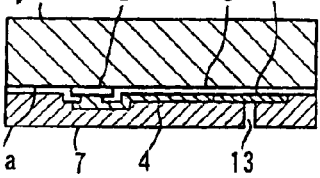
Figure 6H:
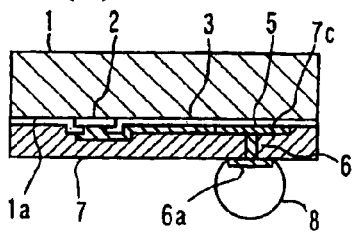
Figure 6E:
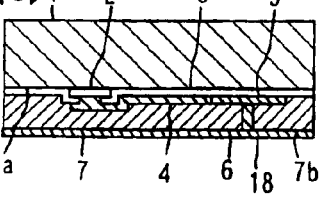

On the surface 1a of a semiconductor element 1, in which a passivation film 3 is formed which exposes a portion of a pad 2 and is on the surface of the pad 2 (FIG. 6(a)), a conductive wiring line 4 is formed extending from the pad 2 to the surface of a protective film 7 by a plating method or a sputtering method, and, at the same time, a land 5 is formed on the surface of the protective film 7 (FIG. 6(b)). A protective film 7 is formed covering the conductive wiring line 4, land 5 and passivation film 3 by a potting method, a printing method or a film attachment method (FIG. 6(c)). An opening 13 is formed through the protective film 7 from its surface 7b to expose the surface of the land 5 by using a laser beam or by etching (FIG. 6(d)). Metal material 18 such as copper (Cu) is filled in the opening 13 and deposited on the surface 7b of the protective film 7 by a sputtering method or a plating method (FIG. 6(e)). The metal material in the opening 13 forms a projection 6. A resist film 16 is formed on the surface 7b of the protective film 7 (FIG. 6(f)) to remove unnecessary metal material 18 to form a protruded portion 6a of the projection 6 (FIG. 6(g)). The protruded portion 6a has a size larger in the horizontal direction than the protruded portion 6b covered with the protective film 7, so that an intervening portion 7c of the protective film exists between the protruded portion 6a and the semiconductor element surface 1a. The protruded portion 6a of the projection 6 is bonded to an external terminal 8 (FIG. 6(h)). The wafer is then cut into a predetermined size to form the semiconductor device of the second embodiment of the invention.

The semiconductor device manufacture method described with reference to FIG. 6 is similar to a general method of manufacturing semiconductor devices from a wafer.

Figure 7:
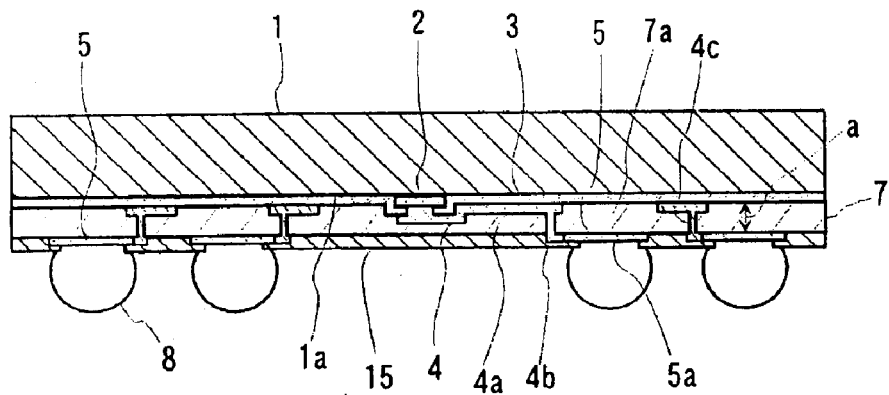
FIG. 7 is a cross sectional view of a semiconductor device according to a third embodiment of the invention.

FIG. 7 is a cross sectional view showing a semiconductor device according to the third embodiment of the invention.

As shown in FIG. 7, the semiconductor device of the third embodiment of this invention has a semiconductor element 1, a passivation film 3 formed on the surface 1a of the semiconductor element and exposing the surfaces of each pad 2, a conductive wiring line 4 connected to each pad 2, a land 5 connected to each conductive wiring line 4, first and second protective films 7 and 15, and external terminals 8.

The pads 2 are disposed vertically in the central area of the surface 1a of the semiconductor element. The conductive wiring line 4 connected to each pad 2 is constituted of a first conductive wiring line 4a disposed on the semiconductor element surface 1a and a second conductive wiring line 4b connected to the land 5. The first protective film 7 is formed over the semiconductor element surface 1a, covering the passivation film 3 and first conductive wiring line 4a and a portion of the second conductive wiring line 4b. The second protective film 15 covers the second conductive wiring line 4b and an area excepting an external terminal bonding area 5a of the land 5. The first and second wiring lines 4a and 4b are disposed in a lamination structure via the first protective film 7. An intervening portion 7a of the first protective film is formed between the land 5 connected to the second conductive wiring line and the passivation film 3. The external terminal 8 is connected to the external terminal bonding area 5a of the land. The pad 2 of the semiconductor element 1 and the external terminal 8 are electrically connected via the conductive wiring line 4 and land 5. The first and second conductive wiring lines 4a and 4b are electrically connected by a vertical wiring line 4c which is part of the second conductive wiring line 4b and extends in a thickness direction of the first protective film 7.

The material of the first protective film 7 may be polyimide resin, polyether imide resin, acrylic denatured epoxy resin, epoxy resin mixed with rubber, silicone resin or the like, respectively of a liquid type or a film shape.

The material of the second protective film 15 may be polyimide resin, epoxy resin, epoxy resin mixed with filler such as glass, or the like, respectively of a liquid type or a film shape.

The elastic modulus of the material used for the conductive wiring line 4 and land 5 is, for example, about 110 GPa for copper (Cu). The material usable for the first protective film 7, for example, polyimide resin, has an elastic modulus of about 1 to 9 GPa. The elastic modulus of the material of the first protective film 7 is, therefore, smaller than that of the material of the land 5. The elastic modulus of the first protective film 7 may be set even smaller by selecting a proper material.

Figure 8:
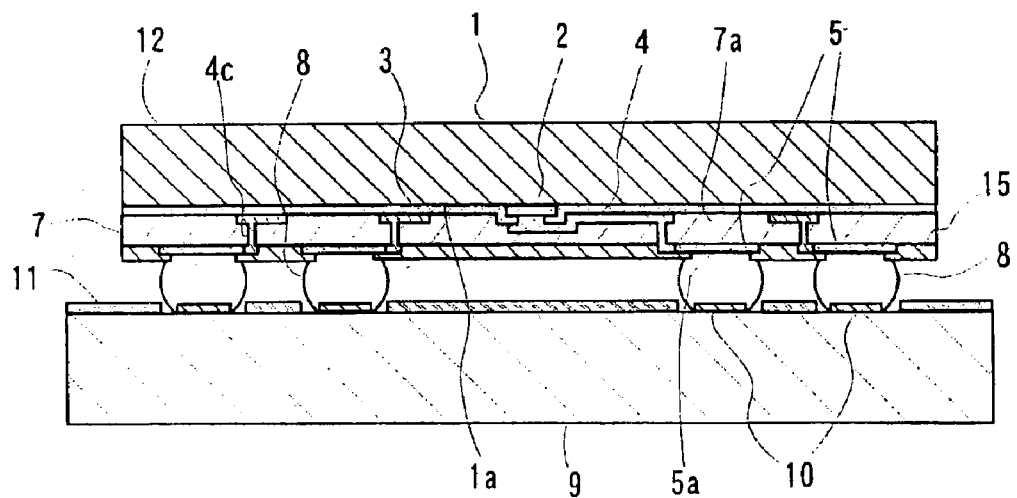
FIG. 8 is a cross sectional view of a semiconductor module having the semiconductor device of the third embodiment shown in FIG. 7 mounted on a printed circuit board.

FIG. 8 is a cross sectional view of a semiconductor module having the semiconductor device of the third embodiment shown in FIG. 7 mounted on a printed circuit board.

A semiconductor device 12 shown in FIG. 7 is mechanically and electrically connected to a printed circuit board 9, by bonding external terminals 8 formed on the surface of the semiconductor device 12 to bonding pads 10 formed on the surface of the printed circuit board 9.

As described above, according to the semiconductor device of the third embodiment of the invention, the first and second conductive wiring lines 4a and 4b are disposed in the lamination structure so that the intervening portion 7a of the first protective film 7 can be formed between the land 5 and the passivation film 3 on the semiconductor element surface 1a. Deformation to be generated in the external terminal 8 because of a coefficient of linear thermal expansion difference between the semiconductor device and printed circuit board can be relaxed by deformation of the intervening portion 7a of the protective film 7 which has a lower elastic coefficient than that of the material of the land 5. It is, therefore, possible to reduce strain to be generated in the bonding areas on both sides of the semiconductor device and printed circuit board.

Even if there is a temperature change under the conditions that the semiconductor device is mounted on the printed circuit board, disconnection defects to be generated in the bonding area of the external terminal can be prevented, and a semiconductor device and a semiconductor module having a high reliability can be realized.

In order to reduce thermal strain to be generated in the external terminal 8, material having a relatively low elastic modulus is selected from the above-described materials as the material of the first protective film 7. It is preferable that the second protective film 15 is made of a material having an elastic modulus higher than that of the material of the first protective film 7.

There is a general tendency that a coefficient of linear thermal expansion of resin material becomes higher as the elastic modulus becomes higher. As the semiconductor device shown in FIG. 7 is subjected to a temperature change, deformation of the first protective film 7 having a lower elastic modulus occurs by contraction and expansion. There is, therefore, a possibility that disconnection occurs at the junction point between the conductive wiring line 4 and pad 2 and at a flexure point of the conductive wiring line 4. If the second protective film 15 in contact with the upper surface of the conductive wiring line 4 is made of material having an elastic modulus higher than that of the material of the first protective film 7, resistance to deformation of the conductive wiring line 4 to be caused by the second protective film 15 increases so that the deformation amount of the conductive wiring line 4 can be reduced and disconnection can be prevented.

Figure 9:
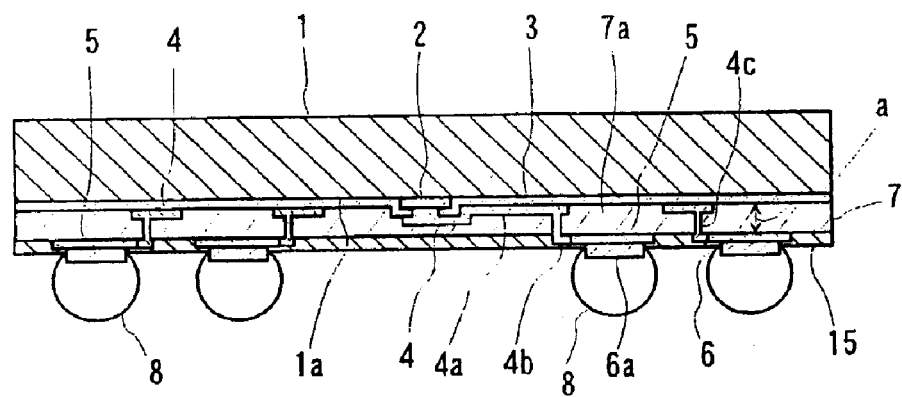
FIG. 9 is a cross sectional view of a semiconductor device according to a fourth embodiment of the invention.

FIG. 9 is a cross sectional view of a semiconductor device of the fourth embodiment of the invention.

Referring to FIG. 9, although the structure of the semiconductor device is similar to the semiconductor device of the third embodiment shown in FIG. 7, there are different points that a projection 6 is formed on a land 5 and that a protruded portion 6a protruding over a second protective film 15 is bonded to an external terminal 8.

Figure 10:
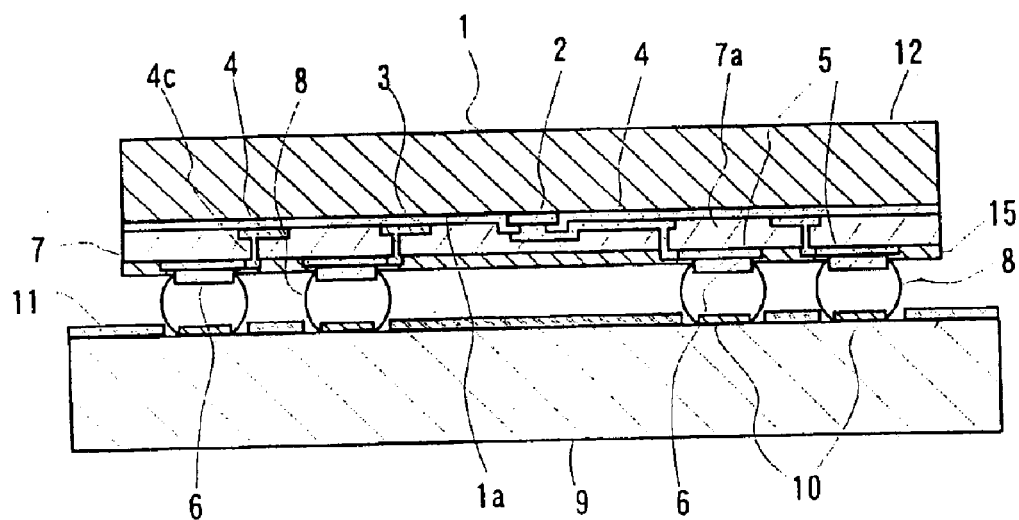
FIG. 10 is a cross sectional view of a semiconductor module having the semiconductor device of the fourth embodiment shown in FIG. 9 mounted on a printed circuit board.

FIG. 10 is a cross sectional view of a semiconductor module having the semiconductor device of the fourth embodiment shown in FIG. 9 mounted on a printed circuit board.

A semiconductor device 12 shown in FIG. 10 is mechanically and electrically connected to a printed circuit board 9, by bonding external terminals 8 formed on the surface of the semiconductor device 12 to bonding pads 10 formed on the surface of the printed circuit board 9.

In this embodiment, the external terminal 8 is bonded to the protruded portion 6a of the projection 6 formed on the land 5. Therefore, even if there is a temperature change under the conditions that the semiconductor device is mounted on the printed circuit board, deformation to be generated in the external terminal near the bonding area between the projection 6 and external terminal 8 on the semiconductor device side can be restricted and the deformation amount can be reduced. It is, therefore, possible to reduce thermal strain to be generated in the external terminal 8 near at the bonding area on the semiconductor device side.

FIG. 11 (including FIGS. 11(a)–11(k)) shows cross sectional views illustrating a method of manufacturing the semiconductor device of the fourth embodiment of the invention shown in FIG. 9. The semiconductor device of the third embodiment of this invention, shown in FIG. 7, can also be manufactured by the process shown in FIG. 11 by omitting a process of forming a projection 6 from the method illustrated in FIG. 11.

Figure 11A:
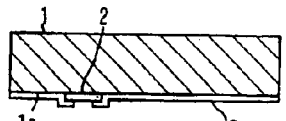
FIGS. 11(a)–11(k) are partial cross sectional views illustrating a method of manufacturing the semiconductor device of the fourth embodiment shown in FIG. 9.
Figure 11B:
Figure 11C:
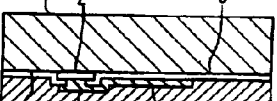
Figure 11D:
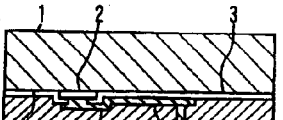
Figure 11E:
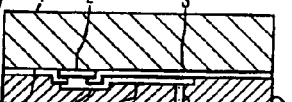
Figure 11F:
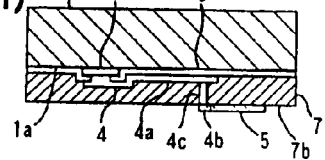
Figure 11G:
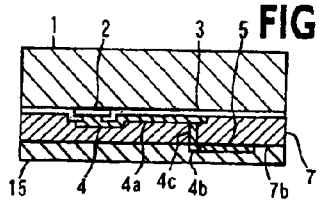
Figure 11H:
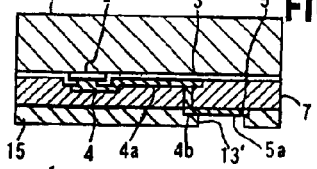
Figure 11I:
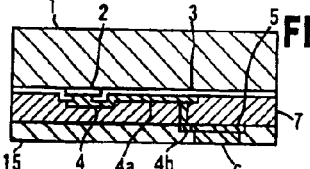
Figure 11J:
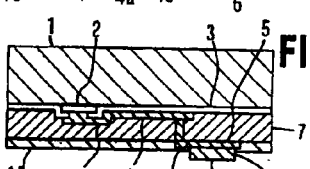
Figure 11K:
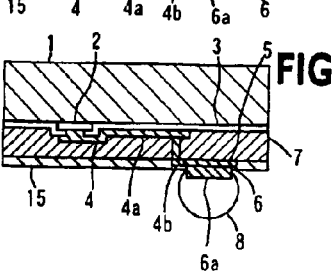

On the surface of a pad 2 and on the surface 1a of a semiconductor element 1 formed with a passivation film 3 exposing a portion of the pad 2 (FIG. 11(a)), a first conductive wiring line 4a connected to the pad 2 is formed by a plating method or a sputtering method (FIG. 11(b)). A first protective film 7 is formed covering the first conductive wiring line 4a and passivation film 3 by a potting method, a printing method or a film attachment method (FIG. 11(c)). An opening 13 is formed from the surface 7b of the first protective film 7 to the surface of the first conductive wiring line 4a by using a laser beam or by etching (FIG. 11(d)). Metal material 18 such as copper (Cu) is filled in the opening 13 and deposited on the surface 7b of the first protective film 7 by a sputtering method or a plating method (FIG. 11(e)). The metal material in the opening 13 forms a vertical wiring line 4c. Unnecessary metal material 18 formed on the surface 7b of the first protective film 7 is removed by etching or the like to form a second conductive wiring line 4b and a land 5 (FIG. 11(f)). A second protective film 15 is formed on the surface 7b of the first protective film 7, covering the second conductive wiring line 4b and land 5 (FIG. 11(g)), and an opening 13' is formed through the second protective film 15 to expose an external terminal bonding area 5a of the land 5 (FIG. 11(h)). Copper (Cu) or the like is filled in this opening 13 to form a projection 6 (FIG. 11(i)), and the second protective film 15 is thinned by etching or the like to form a protruded portion 6a of the projection 6 (FIG. 11(j)). The protruded portion 6a of the projection 6 is bonded to an external terminal 8 (FIG. 11(k)). The wafer is then cut into a predetermined size to form the semiconductor device of the fourth embodiment of the invention.

The semiconductor device manufacture method of this invention described with reference to FIG. 11 is similar to a general method of manufacturing semiconductor devices from a wafer.

The material of the first protective film 7 has an elastic coefficient selected based on the size of a semiconductor element and the number and layout of external terminals. In order to enhance the relaxation effects of strain in the bonding area to be caused by deformation of the intervening portion 7a of the first protective film, the material having a small elastic modulus, preferably in a range from 0.5 GPa to 3 GPa, is used. It is also desired that the material has such an elastic modulus at a low temperature (about −50° C.). In order to retain the strain reduction effect, it is necessary that a thickness a of the intervening portion 7a shown in FIGS. 7 and 9 is set to some degree. The thickness of the intervening portion 7a of the first protective film between the land 5 and passivation film is, preferably, changed with the elastic modulus of the material of the first protective film 7. It is necessary that as the elastic coefficient of the first protective film 7 is made higher, the intervening portion 7a is made thicker. For example, if polyimide resin is used as the material of the first protective film 7, it is desired to select polyimide resin having an elastic modulus of about 1 GPa to 3 GPa and set the thickness a of the intervening portion 7a to 20 μm or thicker.

The first protective film 7 may be made of single material or may have a lamination structure made of a plurality of materials. In the latter case, it is also desired that the elastic modulus of the whole protective film is in the above-described range from 0.5 GPa to 3 GPa.

Figure 12:
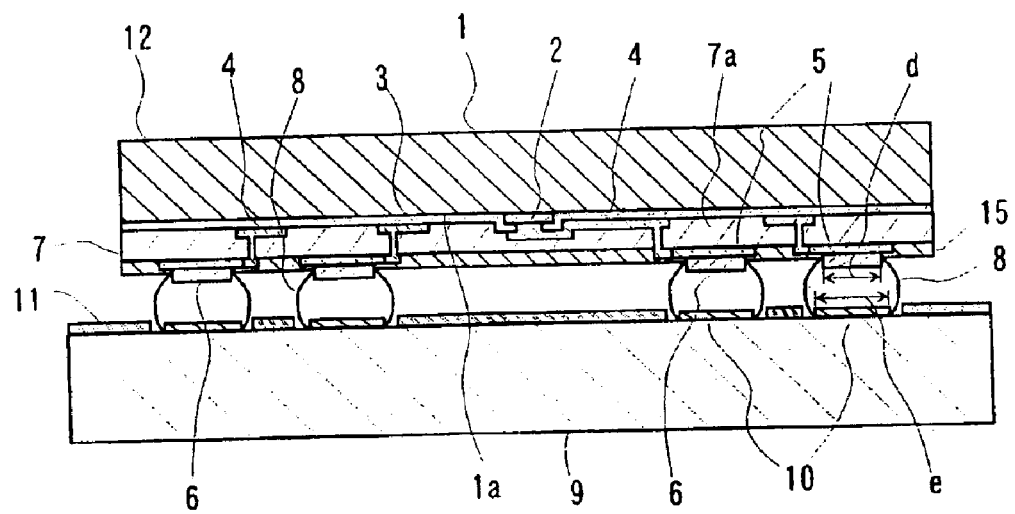
FIG. 12 is a cross sectional view showing another example of a semiconductor module having the semiconductor device of the fourth embodiment shown in FIG. 9 mounted on a printed circuit board.

FIG. 12 is a cross sectional view of a semiconductor module having the semiconductor device of the fourth embodiment of the invention shown in FIG. 9 mounted on a printed circuit board. The bonding area between a bonding pad 10 of a printed circuit board 9 and an external terminal 8 in a horizontal direction, i.e., in a direction of disposing external terminals, is set larger than the bonding area between a protruded portion 6a of a projection 6 on a land 5 of a semiconductor device 12 and the external terminal 8. In FIG. 12, the plan shape of the projection 6 and bonding pad 10 is circular. In order to make the bonding area on the printed circuit board side broader than that on the semiconductor device side, a relation of e>d is satisfied where d is a diameter of the protruded portion 6a of the projection 6 and e is a diameter of the bonding pad of the printed circuit board 9.

By setting the bonding area on the printed circuit board side broader than on the semiconductor device side, the rigidity of the bonding pad 10 increases so that it is possible to reduce the strain to be generated in the bonding area of the external terminal on the printed circuit board side. It is also possible to make small a difference between the strain to be generated in the bonding area of the external terminal on the printed circuit board side and the strain produced by bonding of the protruded portion 6a of the projection 6 in the bonding area of the external terminal on the semiconductor device side. With these functions, even if there is a temperature change, disconnection defects to be generated in the bonding areas of the external terminal on both sides of the semiconductor device and printed circuit board can be prevented, and a semiconductor module having a high reliability as a whole can be realized.

Figure 13:
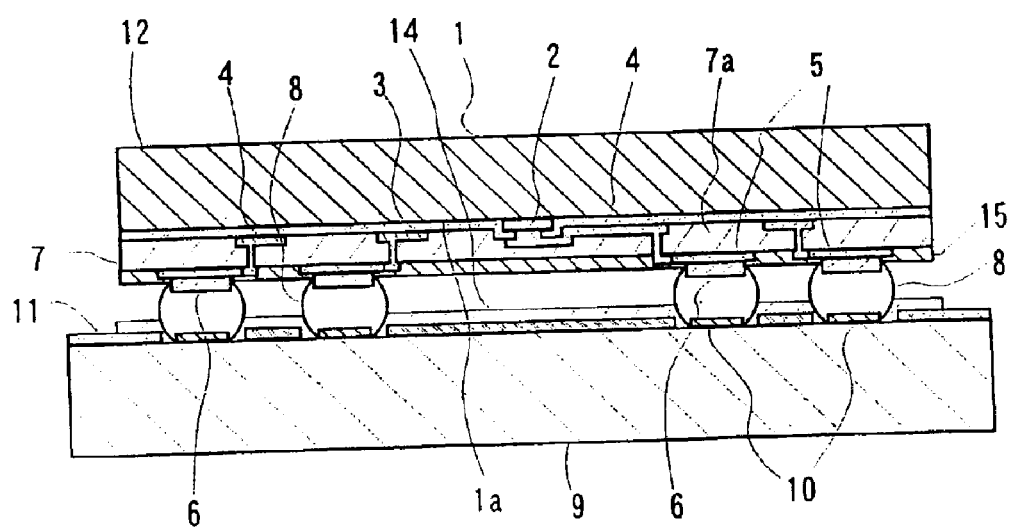
FIG. 13 is a cross sectional view showing still another example.

FIG. 13 is a cross sectional view showing a semiconductor module having the semiconductor device of the fourth embodiment of the invention shown in FIG. 9 mounted on a printed circuit board. On a semiconductor device mount surface 9a of a printed circuit board 9, a reinforcing resin layer 14 is formed covering at least the periphery of the bonding area between an external terminal 8 and a bonding pad 10.

The reinforcing resin layer 14 may be made of epoxy resin, epoxy resin filled with silica particles, or the like. The reinforcing resin layer 14 is formed by mounting a semiconductor device 12 on the printed circuit board 9, and thereafter flowing liquid resin on the printed circuit board surface 9a, followed by heating and hardening it.

By covering the bonding area between the bonding pad 10 of the printed circuit board 9 and the external terminal 8 with the reinforcing resin layer 14, a strain to be generated in the bonding area of the external terminal on the printed circuit board side can be relaxed and reduced. As the strain in the bonding area of the external terminal on the printed circuit board side is reduced, there exists no difference between the strain to be generated in the bonding area between the protruded portion 6a of the projection 6 and the external terminal 8 and the strain reduced by a presence of the intervening portion 7a of the first protective film in the bonding area on the semiconductor device side. It is, therefore, possible to reduce strain to be generated in the external terminal bonding area of the whole semiconductor device.

Even if there is a temperature change under the conditions that the semiconductor device is mounted on the printed circuit board, disconnection defects to be generated in the bonding area of the external terminal can be prevented and a semiconductor device and a semiconductor module having a high reliability can be realized.

Figure 14A:
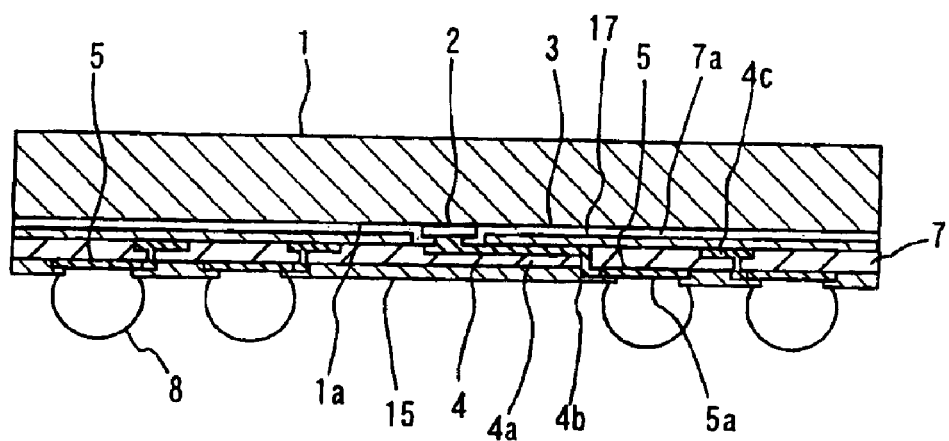
FIGS. 14(a) and 14(b) are cross sectional views showing other examples of the semiconductor device shown in FIGS. 7 and 9, respectively.
Figure 14B:
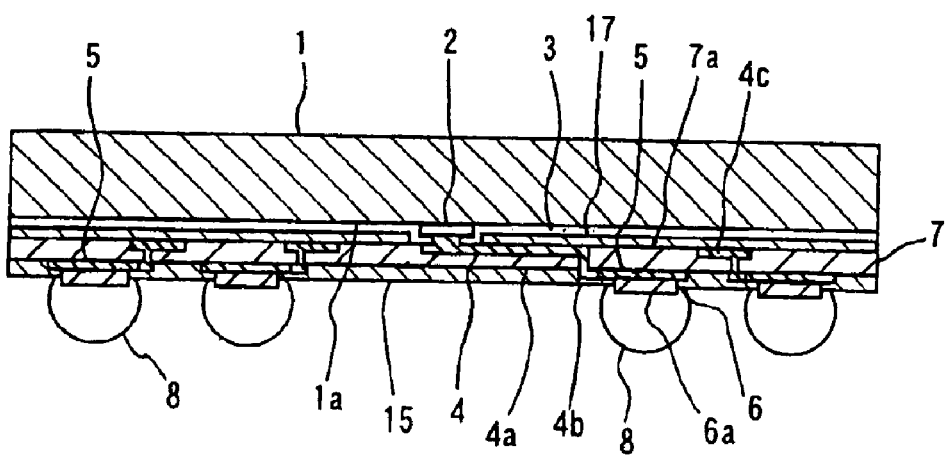

FIGS. 14(a) and 14(b) are cross sectional views showing still other examples of the semiconductor device of the invention shown in FIGS. 7 and 9.

The fundamental structure of the semiconductor device shown in FIG. 14(a) is similar to the semiconductor device shown in FIG. 7, and the fundamental structure of the semiconductor device shown in FIG. 14(b) is similar to the semiconductor device shown in FIG. 9. A different point resides in that a third protective film 17 is formed between a passivation film 3 on a semiconductor element surface 1a and a first conductive wiring line 4a.

The material of the third protective film 17 may be polyimide resin, particularly photosensitive polyimide resin, polyether imide resin, epoxy resin, acrylic denatured epoxy resin, epoxy resin mixed with rubber, silicone resin or the like, respectively of a liquid type or a film shape. The third protective film 17 is formed by using the above-described resin through potting, spin coating, film attachment or the like.

As shown in FIGS. 14(a) and 14(b), by forming the third protective film 17 between the passivation film 3 and first conductive wiring line, it becomes possible to suppress noises to be generated by electric capacitance between unrepresented circuit wiring lines in the semiconductor element 1 and the first conductive wiring line 4a.

It is preferable to form the third protective film 17 thin in order to reduce the electric capacitance between the circuit wiring lines in the semiconductor element 1 and the first conductive wiring line 4a. Although it is necessary to determine the thickness of the third protective film 17 based upon the performance of the semiconductor element and the layout of inner circuit wiring lines, a thickness of about 10 µm is necessary.

Figure 15:
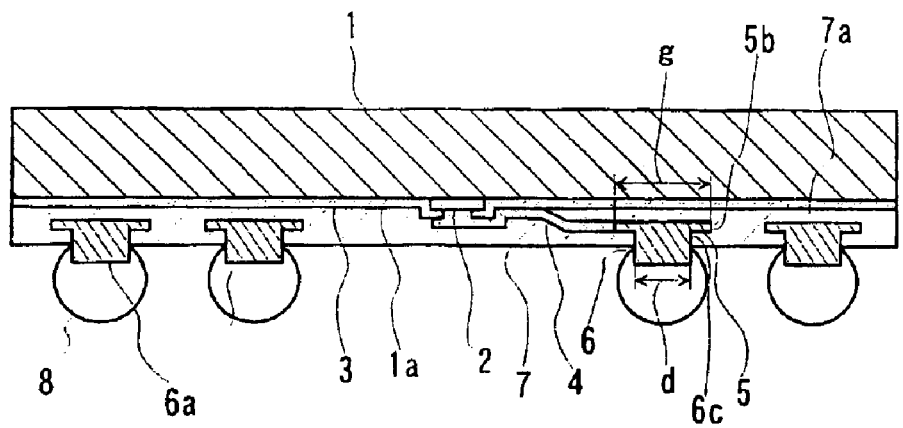
FIG. 15 is a cross sectional view of a semiconductor device illustrating a relation between a land size and a projection size.

As shown in FIG. 15, in the semiconductor device having the projection 6 on the land 5 of this invention described above, it is desired that the size g of the land 5 in the horizontal direction is set larger than the size d of the projection 6 to extend the end 5b of the land 5 outside of the side edge 6c or the projection 6c.

Thermal strain to be generated in the external terminal 8 because of a temperature change can be reduced by restriction of deformation of the external terminal 8 by the projection 6 having a large rigidity. However, deformation by a coefficient of linear thermal expansion difference between the semiconductor device and printed circuit board directly acts upon the projection 6. This deformation of the projection 6 generates stress at the interface between the protective film 7 and the land 5 on which the projection 6 was formed. This stress concentrates particularly upon the end 5b of the land 5 so that crack may be formed from this end in the protective film 7. In order to prevent crack of the protective film 7, the land end 5b is positioned outside of the projection side edge 6c. With this arrangement, the contact area between the land 5 and protective film 7 increases so that the stress generated at the interface therebetween is distributed into the broad contact area and the stress concentrated upon the land end 5b can be relaxed.

Figure 16:
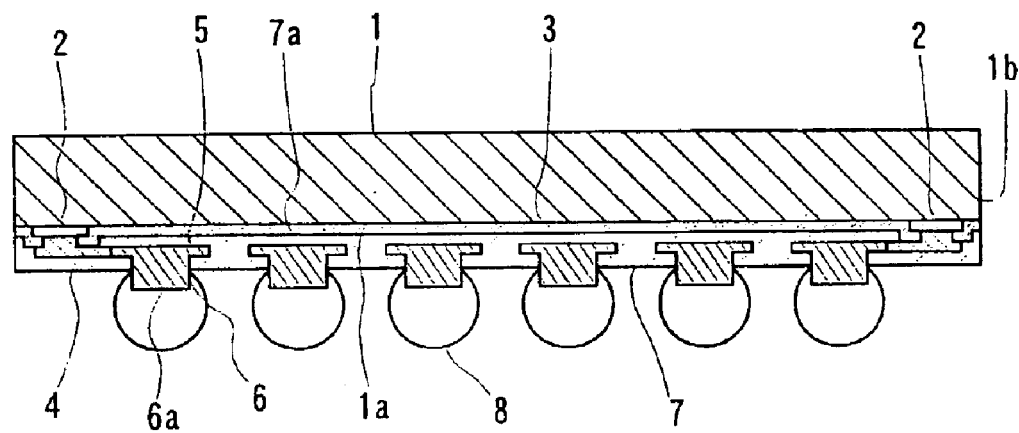
FIG. 16 is a cross sectional view of a semiconductor substrate formed with pads near opposite ends of semiconductor elements.

In the embodiments of the semiconductor device of this invention described above, the pads 2 of the semiconductor element 1 are disposed in the central area of the semiconductor element 1. The positions of the pads 2 of the semiconductor element 1 are not limited only to the central area of the semiconductor element 1, but as shown in FIG. 16, they may be positioned near at opposite ends 1b of a semiconductor element. In the semiconductor element shown in FIG. 16, a conductive wiring line 4 extends from a pad 2 near at the end 1b of the semiconductor element 1 toward the inner area of the semiconductor element. A protective film 7 is formed covering the pad 2, passivation film 3 and land 5 which is connected to the conductive wiring line 4. A projection 6 is formed on the land 5, and an external terminal 8 is bonded to a protruded portion 6a of the projection 6.

The structure in which the pads are formed near at the opposite ends 1b of the semiconductor element 1 is suitable for the semiconductor device constituted of the semiconductor element 1 having a relatively large number of input/output signals.

Figure 17:
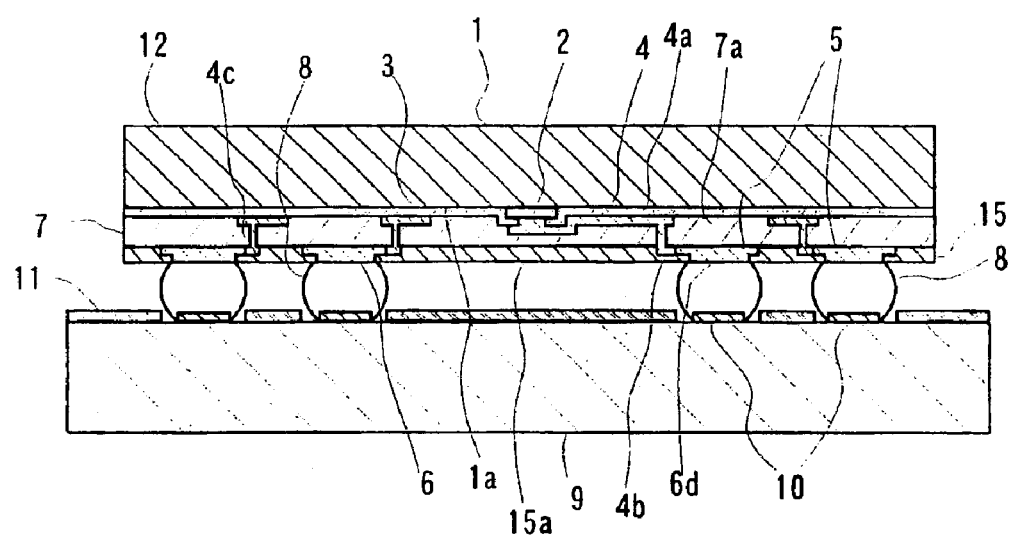
FIG. 17 is a cross sectional view showing another example of a semiconductor module having the semiconductor device of the fourth embodiment shown in FIG. 9 mounted on a printed circuit board.

FIG. 17 is a cross sectional view showing another example of the semiconductor device of the fourth embodiment of the invention shown in FIG. 9, the semiconductor device being mounted on a printed circuit board.

The fundamental structure of the semiconductor device shown in FIG. 17 is similar to that of the semiconductor device shown in FIG. 9. A different point resides in that the surface 6d of a projection 6 formed on a land 5 is flush with the surface 15a of a second protective film 15, and an external terminal 8 is connected to the surface 6d of the projection 6.

Also with the structure shown in FIG. 17, even if there is a temperature change under the conditions that the semiconductor device is mounted on the printed circuit board, deformation of the external terminal 8 near at the bonding area between the external terminal 8 and projection 6 on the semiconductor device side is restricted by the projection 6 having a large rigidity so that the deformation amount of the external terminal 8 can be reduced. Thermal strain to be generated in the external terminal 8 near at the bonding area on the semiconductor side can therefore be reduced.

In order to confirm the thermal strain reduction effects to be obtained when the external terminal 8 is bonded to the protruded portion 6a of the projection 6 formed on the land 5 of the semiconductor device, thermal strain was analyzed by a finite element method. The thickness of the protective film 6 between the land 5 and semiconductor element surface 1a was set to 5 µm, the diameter of the protruded portion 6a and the diameter of the bonding pad were set to 250 µm, the material of the printed circuit board was epoxy resin (corresponding to FR-4) mixed with glass cloth, and the temperature was changed from 125° C. to −55° C. As shown in Table 1, the thermal strain generated in the external terminal 8 reduced to 2.7% by forming the projection 6, whereas the thermal strain when not forming the projection 6 was 3.4%.

TABLE 1

|  | Maximum strain (%) generated in external terminal |
| --- | --- |
| With projection (b = 0.02 mm) | 2.7 |
| Without projection | 3.4 |

Thermal strain was analyzed by a finite element method by setting the bonding pad size of a printed circuit board for bonding the external terminal 8 larger than the size of the bonding area (or protruded portion 6a) on the semiconductor device side for bonding the external terminal 8. The results are shown in Table 2. If the diameter e of the bonding pad and the diameter d of the bonding area on the semiconductor device side are the same and no projection 6 is formed, a difference between the strain generated on the printed circuit board side and the strain generated on the semiconductor device side becomes large. If the projection 6 is formed and bonded to the external terminal 8 and the diameter e of the bonding pad is set larger than the diameter d of the projection 6a, a difference between strains generated on the sides of both the printed circuit board and semiconductor device can be made small.

TABLE 2

| Projection | Bonding pad diameter e/ diameter d of bonding area (projection) on semiconductor device side | strain on printed circuit board side/strain on semiconductor device |
| --- | --- | --- |
| Without | 1 | 0.72 |
| With (b = 0.02 mm) | 1 | 1.11 |
| With (b = 0.02 mm) | 1.14 | 1.02 |

As described so far, according to the semiconductor device and semiconductor module of this invention, a strain to be generated in the external terminal because of a coefficient of linear thermal expansion difference between a printed circuit board and the semiconductor device mounted on the board can be reduced and disconnection of the external terminal can be prevented. The invention is effective in preventing disconnection of the external terminal of a semiconductor device, particularly, a semiconductor device of a chip size to be manufactured by wafer processes. A small semiconductor device and a semiconductor module having a high reliability can therefore be provided.

What is claimed is:

1. A semiconductor device comprising:

a semiconductor substrate formed with pads;

a passivation film formed on a surface of said semiconductor substrate on a pad forming side; and lands for connection to external terminals, said lands being formed on an insulating film formed on a surface of said passivation film opposite to said semiconductor substrate;

wherein:

said pads and said lands are connected by conductive wiring lines;

said external terminals are solder bumps and said lands are formed of a material comprising Cu; and projections, made of a material comprising Cu, are formed on each of said lands at positions where said lands are connected to the external terminals.

2. A semiconductor device comprising:

a silicon substrate formed with pads;

a passivation film formed on a surface of said silicon substrate on a pad forming side;

lands for connection to external terminals which are solder bumps, said lands being made of a material comprised of Cu and formed on the surface of said silicon substrate on the pad forming side, respectively; and wiring lines connecting said pads and said lands;

wherein:

an insulating film is formed between said passivation film and said lands;

projections, made of a material comprising Cu, are formed on said lands on a surface opposite to said silicon substrate; and said projections are connected to the external terminals, respectively.

3. A semiconductor device comprising:

a semiconductor substrate formed with pads;

a passivation film formed on a surface of said semiconductor substrate on a pad forming side;

lands for connection to external terminals, said lands being formed on the surface of said semiconductor substrate on the pad forming side;

wherein said external terminals are solder bumps and said lands are formed of a material comprising Cu;

the external terminals being connected to said lands;

wherein said projections, made of a material comprising Cu, are formed on said lands at positions where said lands are connected to the external terminals, respectively; and wiring lines connecting said pads and said lands;

wherein an insulating protective film is formed on the surface of said semiconductor substrate on the pad forming side in an area other than the external terminals.

4. A semiconductor device according to any one of claims 1, 2, or 3, wherein in a semiconductor module having the semiconductor device mounted on a printed circuit board via the external terminals, a bonding area between a bonding pad of the printed circuit board and one of the external terminals is set larger than a bonding area between one of the projections and said one of the external terminals in a direction of disposing the external terminals.

5. A semiconductor device according to any one of claims 1, 2, or 3, to wherein in a semiconductor module having the semiconductor device mounted on a printed circuit board via the external terminals, an area near a bonding area between a bonding pad of the printed circuit board and one of the external terminals is covered with resin.

6. A semiconductor device according to claim 1 or 2, wherein said projections each include a first portion which extends into a corresponding one of said external terminals and a second portions located between a corresponding one of said lands and said first portion.

7. A semiconductor device according to claim 6, wherein each of said first portions of said projections has substantially the same width as a corresponding one of said second portions of said projections.

8. A semiconductor device according to claim 1, wherein the projections are positioned in projected areas of said lands.

9. A semiconductor device according to claim 2, wherein the projections are positioned in projected areas of said lands.

10. A semiconductor device according to claim 1, wherein the external terminals and the projections are respectively each bonded via a metal thin film formed on a surface of the projection.

11. A semiconductor device according to claim 2, wherein the external terminals and the projections are respectively each bonded via a metal thin film formed on a surface of the projection.

12. A semiconductor device according to claim 1, wherein a protective film having an opening in a region in which said land is disposed is formed on said conductive wiring and a portion of said projection is projected from a surface of said protective film.

* * * * *